Oct. 12, 1965 D. BAKALAR Re. 25,875

CRYSTAL DIODE

Original Filed Nov. 22, 1954

INVENTOR.
David Bakalar
BY
Ezekiel Wolf
his attorney

United States Patent Office

Re. 25,875
Reissued Oct. 12, 1965

25,875
CRYSTAL DIODE

David Bakalar, Boston, Mass., assignor to Transitron Electronic Corporation, Wakefield, Mass., a corporation of Delaware Original No. 2,832,016, dated Apr. 22, 1958, Ser. No. 470,408, Nov. 22, 1954. Application for reissue May 31, 1962, Ser. No. 200,024
8 Claims. (Cl. 317—236)

Matter enclosed in heavy brackets [ ] appears in the original patent but forms no part of this reissue specification; matter printed in italics indicates the additions made by reissue.

The present invention relates to a crystal valve or rectifier of the diode type, hermetically sealed in a glass tube of materials such as germanium, silicon or some such similar crystal element wherein a conductor is connected to the crystal at one face and so called "cat whisker" is connected to the other face.

The present invention relates particularly to the method of construction and the combination of crystal and "cat whisker" used in forming the diode or rectifier.

In the present invention the method and means of construction provide an exceedingly rugged crystal transistor which gives faithful performance and constant characteristic conditions which may be reliably established in manufacturing specifications and under operating conditions.

One of the features of the present invention is that the "cat whisker," so called, forms a permanent connection with the germanium or other type of crystal which may be used in the nature of eutectic alloy junction which is sealed and permanent and will not under ordinary conditions pull loose or free from the crystal itself.

In addition to this, the crystal and the connecting "cat whisker" are so selected with regard to added impurities to enhance the reliability of the elements when used as a rectifier or transistor in the usual electric circuit.

A further feature of the present invention is that in the construction of the diode or crystal rectifier, the lead-in wires have glass beads formed thereon prior to the insertion of the diode elements into the casing so that all that is necessary is to seal the bead into the casing which makes it possible to attach the electrodes under conditions of lower temperature than otherwise would be possible.

Figure 1:
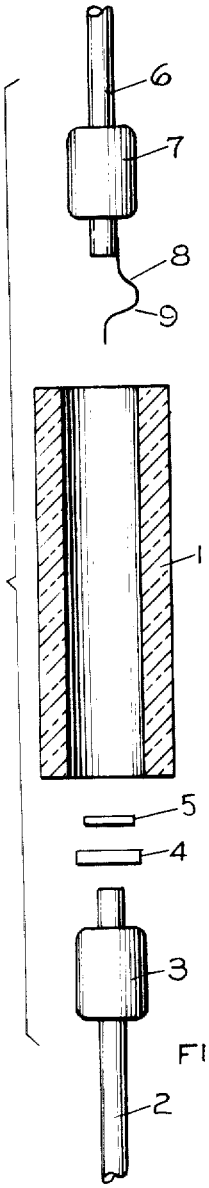
Figure 2:
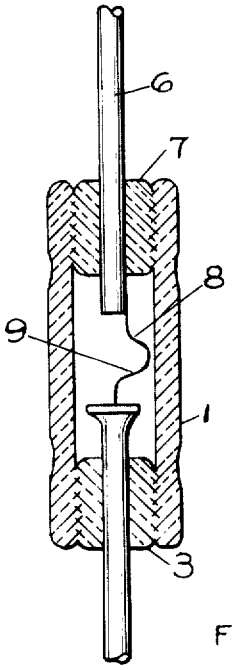

Other and further advantages will be more readily understood from the description in the specification set forth below when taken in connection with the drawings, in which:

FIGURE 1 shows an exploded view of the elements forming the diode or rectifier of the present invention, and, FIGURE 2 shows a section through the complete diode.

In the drawing of FIGURE 1, 1 illustrates a glass vessel. 2 is a conductor with a glass bead 3 mounted on it. 4 is a conductive mounting plate, and 5 is a germanium silicon or other type crystal.

At the top section of the drawing of FIGURE 1, there is shown the upper connector 6 and the "cat whisker" 8, preferably made of gold or aluminum wire with added impurities of the third or fifth column of the periodic table. If the impurities of the third column are used, impurities would comprise indium, gallium, aluminum or some other similar element. If impurities of the fifth column were used, they may be antimony or arsenic or some other equivalent elements.

The "cat whisker" 8 is welded at one end to the conductor 6 and is preferably formed with a spring bend 9 to allow for adjustment to the face of the crystal 5. The crystal 5 is preferably made of germanium, silicon or some other crystal material with added impurities of a different periodic column than the impurity used in the "cat whisker," that is, if the impurity in the "cat whisker" is of column 3 of the periodic table, that in the crystal would be of column 5.

While this type of combination may have been used as far as it is known, the reverse has never been used, that is using impurities of the third periodic table for the crystal and impurities of the fifth periodic table for the connecting "cat whisker."

I have found that in crystal rectifiers the use of impurities of the fifth periodic table in the "cat whisker" with the impurities of the third periodic table in the crystal itself, provides an improved construction and operation of the diode crystal, particularly when the wire is actually fused or sealed to the crystal as in the present invention. Not only is the fusing readily accomplished, but the reliability of connection and performance is greatly improved in this combination.

In FIGURE 1, elements 2, 4, 6 and 8 are all conductors and the element 5, the crystal, is a so called semi-conductor. In putting the diode together, the bead 3 is first sealed to the conductor 2 and then the conductor and the bead 3 are sealed into the lower end of the tube 1 by fusing the bead directly to the wall of the tube 1 on its inner side.

The conducting plate 4 may be mounted on the upper end of the conductor 2 as viewed in FIGURE 1 prior to the sealing of the bead and the conductor in the tube or the conducting plate 4 may be soldered to the end of the conductor 2 when it is inside the tube.

However it is not desirable to attach the germanium crystal or the crystal 5 to the plate 4 until after the bead has been fused to the tube.

A low melting point solder is used to attach the crystal 5 to the conducting plate 4 after the bead 3 and plate 4 have been put in place. With the crystal then fixed in place the conductor 6 with the bead 7 and the "cat whisker" 8 already attached to the conductor is inserted in the top end of the glass casing 1 and the bead is sealed in the end of the casing or tube as shown in FIGURE 2.

The end of the "cat whisker" 8 with its spring bend 9 formed in it is forced against the surface of the crystal and sealed into the crystal surface in a permanent joint. The sealing of the end of the "cat whisker" into the surface of the crystal forms a solid eutectic alloyed junction of the permanent type which remains in the same position at all times.

The "cat whisker" 8 is preferably formed of a gold or aluminum wire and has impurities preferably of the periodic tables of the fifth column, among which preferably are antimony and arsenic. With this type of impurity used in the gold or aluminum "cat whisker," the crystal itself should have impurities of the third column, such as indium, gallium or aluminum for the best operating combination for the crystal.

Fusing of the "cat whisker" to the surface of the germanium crystal may be accomplished by a current passed through the "cat whisker" and crystal after the construction has been completed. *As used herein with respect to the junction between the crystal and cat-whisker, the words "fused" and "fusing" refer specifically and are limited to the formation of a solid eutectic alloyed rectifying junction.*

The case is of course hermetically sealed by sealing the beads in the ends of the tube and the heating of the tube prior to the sealing of the beads in the tube exhaust substantially sufficient air in the tube so that it is not necessary to pump the residuary air out of the tube. However this could be done if necessary.

The crystal and the "cat whiskers" are preferably both mounted on Dumet wire which is a wire which has substantially the same coefficient of expansion as the glass in which the wire is sealed. Dumet wire is a wire of a core of iron with outer layers of brass and copper to form a composite conducting wire having substantially the same coefficient of expansion as that of the glass.

Having now described my invention, I claim:

1. A method of manufacturing an enclosed crystal diode which comprises forming on a conducting wire a glass bead adapted to fit into one end of an enclosing vessel of glass, fusing the wire with the bead formed thereon in said end of the tube, then heat sealing a crystal electrode on the end of the conductor in the tube, after which a second conducting wire with a bead mounted thereon is fused in the other end of the tube with a "cat whisker" metallic conductor extending from said second conductor and fused to the surface of the crystal.

2. A crystal diode comprising an enclosing glass vessel, a conductor extending through each end of the vessel to the inside thereof, a bead formed on [the conductors] *each conductor* for sealing the conductors in the vessel, a conductive mounting plate mounted at the end of one conductor, a crystal mounted on said plate within the enclosing vessel, a "cat whisker" conductor welded to the other conductor within the tube, said "cat whisker" being fused to the surface of the crystal at the end of the "cat whisker" *and forming therewith a portion having a solid eutectic alloyed rectifying junction.*

3. A method of manufacturing an enclosed crystal diode which comprises forming on conducting wires, glass beads adapted to fit into each end of an enclosing vessel, fusing one wire with a bead thereon into one end of the vessel, then soldering a crystal electrode on the inner end of the wire within the vessel, inserting a second glass bead in the other end of the vessel with a conducting wire having a "cat whisker" attached thereto in contact with the electrode at the end of the wire within the tube *and forming a solid eutectic alloyed rectifying junction by fusing said cat-whisker to the surface of said electrode.*

4. A diode crystal construction comprising an enclosing glass vessel having a conductor fused in one end of the glass vessel with a bead forming a part of the end thereof, a conductive mounting plate fixed to the end of the conductor, a germanium crystal soldered to said mounting plate within the vessel, a second conductor extending through the opposite end of the glass vessel with a bead thereon fused to the walls of the glass vessel forming the end seal of the glass vessel, said second conductor having a "cat whisker" bearing on the germanium crystal surface *and forming therewith a solid eutectic alloyed rectifying junction* [and fused thereto].

*5. A method of manufacturing an enclosed crystal diode which comprises forming on conducting wires, glass beads adapted to fit into each end of an enclosing vessel, fusing one of said wires with a bead thereon onto one end of said vessel by fusing said bead to the wall of said vessel, then soldering a semiconductor crystal containing impurities selected from the group consisting of the elements of the third and fifth column of the periodic table on the inner end of said wire within said vessel, inserting in the other end of said vessel a second of said glass beads with its conducting wire having attached to it a metallic "cat whisker" with said "cat whisker" in contact with said crystal which is at the end of said first mentioned wire within said vessel and thereafter sealing said second bead to said vessel and forming a solid eutectic alloyed rectifying junction by fusing said cat-whisker to said crystal.*

*6. A method as set forth in claim 5 wherein said "cat whisker" is formed of gold doped with impurities of the third column of the periodic table, and said crystal is formed of a semiconductor material selected from the group consisting of germanium and silicon, doped with an impurity of the fifth column of the periodic table.*

*7. A method as set forth in claim 5 wherein said "cat whisker" is formed of gold doped with impurities of the fifth column of the periodic table, and said crystal is formed of a semiconductor material selected from the group consisting of germanium and silicon, doped with an impurity of the third column of the periodic table.*

*8. A method as set forth in claim 5 wherein said "cat whisker" is formed of aluminum.*

References Cited by the Examiner

The following references, cited by the Examiner, are of record in the patented file of this patent or the original patent.

UNITED STATES PATENTS

| | | | |
|---|---|---|---|
| 2,633,489 | 3/53 | Kinman | 317—236 |
| 2,693,555 | 11/54 | North et al. | 317—236 |
| 2,694,168 | 11/54 | North et al. | 317—236 |
| 2,697,806 | 12/54 | Gates | 317—236 |
| 2,704,818 | 3/55 | North | 317—236 |
| 2,705,768 | 4/55 | Kleimack et al. | 317—236 |
| 2,724,761 | 11/55 | Cisne | 317—236 |
| 2,770,763 | 11/56 | Matthews | 317—236 |
| 2,785,349 | 3/57 | Wolfson et al. | 317—236 |
| 2,795,743 | 6/57 | Lehovec | 317—236 |
| 2,817,798 | 12/57 | Jenny | 317—236 X |
| 2,818,536 | 12/57 | Carman et al. | 317—236 |
| 2,861,230 | 11/58 | Le Loup | 317—236 |

JOHN W. HUCKERT, *Primary Examiner.*

GEORGE N. WESTBY, DAVID J. GALVIN, *Examiners.*